US005453886A

United States Patent [19]
Kobayashi et al.

[11] Patent Number: 5,453,886
[45] Date of Patent: Sep. 26, 1995

[54] DIGITAL RECORDING METHOD USING A SPECIFIED MAGNETIC RECORDING MEDIUM

[75] Inventors: Koji Kobayashi; Mitsuru Takai, both of Miyota, Japan

[73] Assignee: TDK Corporation, Tokyo, Japan

[21] Appl. No.: 181,160

[22] Filed: Jan. 13, 1994

Related U.S. Application Data

[63] Continuation of Ser. No. 44,120, Apr. 8, 1993, abandoned, which is a continuation of Ser. No. 757,613, Sep. 11, 1991, abandoned.

[30] Foreign Application Priority Data

| Sep. 11, 1990 | [JP] | Japan | 2-241833 |
| Jun. 20, 1991 | [JP] | Japan | 3-175989 |
| Jun. 20, 1991 | [JP] | Japan | 3-175990 |
| Jun. 20, 1991 | [JP] | Japan | 3-175991 |

[51] Int. Cl.$^6$ .................................. G11B 5/00
[52] U.S. Cl. .................. 360/46; 428/212; 428/216; 428/611; 428/637; 428/668; 428/678; 428/693; 428/694 TM; 428/900; 428/928
[58] Field of Search .................. 428/694, 900, 428/693, 637, 668, 678, 611, 694 TM, 212, 216, 928; 427/128; 204/192.2; 360/40, 46, 48

[56] References Cited

U.S. PATENT DOCUMENTS

| 4,387,136 | 6/1983 | Saito et al. | 428/328 |
| 4,477,489 | 10/1984 | Yanai et al. | 427/132 |
| 4,511,594 | 4/1985 | Yanai et al. | 427/38 |
| 4,520,076 | 5/1985 | Saito et al. | 428/611 |
| 4,548,871 | 10/1985 | Kobayashi et al. | 428/593 |
| 4,702,938 | 10/1987 | Yasunaga et al. | 427/132 |
| 4,770,924 | 9/1988 | Takai et al. | . |
| 4,900,622 | 2/1990 | Nakayama et al. | . |
| 5,139,849 | 8/1992 | Takagi et al. | 428/143 |
| 5,225,234 | 6/1993 | Takai et al. | . |

FOREIGN PATENT DOCUMENTS

| 3113559 | 2/1988 | Germany . |
| 3939625 | 6/1990 | Germany . |
| 4912082 | 4/1972 | Japan . |
| 49-12083 | 2/1974 | Japan . |
| 63-9015 | 1/1988 | Japan . |
| 63-10314 | 1/1988 | Japan . |
| 63-39127 | 2/1988 | Japan . |
| 2227116 | 7/1990 | United Kingdom . |

OTHER PUBLICATIONS

1885 Digests of Intermag'85, International Magnetics Conference Apr. 29–May 2 1985, p. GA–4, R. Tsui, et al., "Perpendicular Recording performance of Thin Film Probe Heads and Douple–Layer CoCr Media".

IEEE Translation Journal on Magnetics in Japan, vol. 5, No. 3, March 1990, pp. 252–260, K. Nishimura, et al., "Approximate Analysis of Perpendicular Magnetic Recording Characteristics".

IEEE Transactions on Magnetics, vol. 26, No. 1, Jan. 1990, pp. 97–99, S. Iwasaki, et al., "On Design of Co–Cr Perpenducular Recording Media for Usage of a Ring–Type Head".

Patent Abstracts of Japan, vol. 6, No. 1, (P–A–57 143 731, Akio Yanai, et al., Sep. 6, 1982.

*Primary Examiner*—Stevan A. Resan
*Attorney, Agent, or Firm*—Oblon, Spivak, McClelland, Maier & Neustadt

[57] ABSTRACT

A magnetic recording medium for digital recording has a magnetic layer on a non-magnetic substrate. The magnetic layer includes a lower layer of ferromagnetic metal thin film nearer to the substrate surface and an upper layer of ferromagnetic metal thin film, each ferromagnetic metal thin film being composed of columnar grains deposited by oblique evaporation process. The average growth directions of columnar grains in the lower and upper layers intersect each other from opposite sides of a normal to the substrate surface. Digital recording is carried out by means of a magnetic head in relative motion toward or opposite to the growth direction of columnar grains in the upper layer.

6 Claims, 5 Drawing Sheets

DIGITAL RECORDING METHOD USING A SPECIFIED MAGNETIC RECORDING MEDIUM

This application is a continuation of application Ser. No. 08/044,120, filed on Apr. 8, 1993, now abandoned, which is a continuation of application Ser. No. 07/757,613 filed Sep. 11, 1991, abandoned.

This invention relates to a magnetic recording medium intended for digital recording.

BACKGROUND OF THE INVENTION

One of the requirements enabling commercial practice of HDTV is the development of magnetic tape capable of high density recording so that numerous digital image signals may be recorded in a compact cassette. Technical Report of Television Society, Vol. 13, No. 59, pages 19–24 (1989) discloses an experiment of digital image recording on magnetic tape having magnetic metal powder coated thereon. Technical Research Report of Electronic Information Communication Society, MR 90-15, pages 39–44, discloses an experiment using Co-Cr evaporated perpendicular magnetic tape.

Magnetic tape having a magnetic layer in the form of a ferromagnetic metal thin film containing a major proportion of Co and a minor proportion of Ni and the like formed by oblique evaporation process are known to have a high saturation magnetic flux density, high coercive force, and improved electromagnetic properties. Technical Research Report of Electronic Information Communication Society, MR 90-7, pages 43–49, discloses a study on the recording mechanism of magnetic tape of the oblique evaporation type by recording rectangular wave signals and analyzing traveling direction dependency and other properties, thereby examining solitary waves reproduced from the magnetic tape. As seen from FIG. 1 on page 43 of this report, the evaporated tape used in this study has a magnetic layer in the form of a monolayer evaporated film which is obliquely evaporated in one direction to allow for unidirectional growth of columnar grains.

In one experiment, solitary wave signals are recorded with optimum recording current flow and then reproduced both while feeding the tape in forward and reverse directions. An observation of four solitary waveforms reproduced in the forward and reverse directions shows that the time taken from the zero cross point to the peak point is less than ⅕ or more than 5 times the time taken from the peak point to the zero cross point as seen from FIG. 4 on page 45. This indicates the appreciable asymmetry of reproduced waveform. The four reproduced waveforms overlap only a little and the overlap of more than zero peaks between the most differing reproduced waveforms is less than 60%. If solitary waveforms reproduced are asymmetric and distorted as mentioned above and waveforms become inconsistent depending on whether recording and reproducing operations are in forward or reverse direction, then actual recording and reproducing operations would result in an increased error rate and a low S/N ratio and require a complex equalizer circuit or even be difficult to equalize. If reproduced waveforms have a degree of distortion, a problem would arise with respect to interchangeability with the so-called metal tape.

Since the commercial standards employ band compression, only a small margin is left for error correction. Then to reduce error rate is an important problem. If the reproduced waveforms are asymmetric, then a width per unit waveform known as "window margin" must be increased in order to suppress the error rate. Such an increased window margin is detrimental to high density recording. A high sampling frequency and a high S/N are not achievable.

It is to be noted that some asymmetry of reproduced waveforms can be corrected by means of an equalizer circuit. But increased asymmetry is quite difficult or impossible to correct. Interchangeability with coating type metal tape is lost. Coating type metal tape provides reproduced waveforms of good symmetry since the easy axis of magnetization is in the plane of the magnetic layer.

Magnetic recording media for digital recording are required to provide not only reproduced waveforms of symmetry, but also a high output because lower outputs result in higher error rates.

SUMMARY OF THE INVENTION

Therefore, an object of the present invention is to provide a magnetic recording medium for digital recording in which solitary waveforms reproduced are less asymmetric and less distorted, reproduced waveforms are consistent even when the reproducing direction is reversed from the recording direction, a reduced error rate and a minimal loss of S/N ratio are achieved, and no equalization is required or only a simple equalizer circuit is required.

Another object of the present invention is to provide a magnetic recording medium for digital recording wherein solitary waveforms reproduced contain a minimal component of asymmetry and high outputs are obtained.

The oblique evaporation process (also known as deposition process of continuously varied incidence) for forming a ferromagnetic metal thin film for a magnetic recording medium involves the step of feeding a non-magnetic substrate along the circumferential surface of a rotating chill drum and directing an electron beam to a ferromagnetic metal source to evaporate the metal whereby the evaporated ferromagnetic metal deposits on the substrate. As is usual, the angle included between the incident direction of ferromagnetic metal during evaporation and a normal to the surface of the non-magnetic substrate is designated incident angle. The incident angle varies from a maximum incident angle θmax to a minimum incident angle θmin during the oblique evaporation process. The maximum incident angle θmax is up to 90 degrees and the minimum incident angle θmin is more than 0 degree. For a given point on the substrate, the incident angle gradually decreases from the start to the end of evaporation. Evaporation of ferromagnetic metal takes place over the angle Δθ=θmax−θmin. Then in the ferromagnetic thin film deposited on the non-magnetic substrate, the columnar grains orient nearly parallel to the substrate surface where they are deposited near the substrate and grow archwise as they are spaced apart from the substrate surface.

According to the present invention, at least two obliquely evaporated ferromagnetic metal thin films are formed to provide a magnetic layer. While feeding the substrate in a forward direction, a ferromagnetic metal is evaporated to form a first thin film consisting of at least one layer wherein grains are oriented in a first direction. Then the substrate is fed in a reverse direction and the same or different ferromagnetic metal is evaporated to form a second thin film consisting of at least one layer wherein grains are oriented in a second direction opposite to the first direction. In this way, the second thin film is stacked on the first thin film.

By stacking the first and second ferromagnetic metal thin films in this way and controlling the Δθ and thickness of the respective thin films, solitary waveforms reproduced become more symmetrical and less distorted and waveforms remain consistent upon reversal between forward and reverse directions in recording and reproducing operations.

According to a first form of the present invention, there is provided a magnetic recording medium for digital recording comprising a magnetic layer on a surface of a non-magnetic substrate. The magnetic layer includes (i) a first thin film consisting of at least one layer of cobalt base ferromagnetic metal formed by oblique evaporation process in a first direction and (ii) a second thin film consisting of at least one layer of cobalt base ferromagnetic metal formed by oblique evaporation process in a second direction different from the first direction. The total thickness of the first ferromagnetic metal thin film is 0.7 to 1.3 times the total thickness of the second ferromagnetic metal thin film. The sum of t·Δθ of the respective layers constituting the first ferromagnetic metal thin film is 0.7 to 1.3 times the sum of t·Δθ of the respective layers constituting the second ferromagnetic metal thin film, provided that the layers constituting the first and second ferromagnetic metal thin films each have a thickness t.

Preferably, when positive and negative solitary wave signals are recorded with optimum recording current flow and then reproduced, the time from the zero cross point to the peak point is 0.5 to 2 times the time from the peak point to the zero cross point of the reproduced signal.

Preferably, when positive and negative solitary wave signals are recorded with optimum recording current flow while moving the medium in forward and reverse directions and then reproduced while moving the medium in forward and reverse directions, and when the thus reproduced waveforms are laid one on another, the overlap between the reproduced waveforms is at least 70%.

Often, digital recording uses signals having a half value width of 50 to 500 nsec. and a recording wavelength of 0.35 to 0.80 μm.

Approximately equivalent results are obtained in the first form regardless of the direction of the magnetic head in relative motion to the medium.

Second and third forms of the present invention are directed to a magnetic recording medium for digital recording comprising a magnetic layer on a surface of a non-magnetic substrate. The magnetic layer includes a lower layer consisting of at least one ferromagnetic metal thin film nearer to the substrate surface and an upper layer consisting of at least one ferromagnetic metal thin film, each ferromagnetic metal thin film being composed of columnar grains deposited by oblique evaporation process. The average growth direction of columnar grains in the lower layer and the average growth direction of columnar grains in the upper layer intersect each other from opposite sides of a normal to the substrate surface.

In the second form, digital recording is carried out by means of a magnetic head in relative motion toward the growth direction of columnar grains in the upper layer. In this case, the thickness of the lower layer should be 1.2 to 5.0 times the thickness of the upper layer.

In the third form, digital recording is carried out by means of a magnetic head in relative motion opposite to the growth direction of columnar grains in the upper layer.

In either of the second and third embodiments, reproduced waveforms are improved in symmetry and high outputs are achieved. Then a low error rate is obtained. The window margin per unit waveform is narrow enough to enable short-wavelength recording, thus ensuring high density recording. A higher sampling frequency can be used, resulting in a high S/N ratio. Equalization is easy or eliminated, with improved interchangeability with coating type metal tape and other media.

DETAILED DESCRIPTION OF THE INVENTION

First embodiment

The non-magnetic substrate used herein may be formed of any desired material which can withstand heat encountered during formation of ferromagnetic metal thin films by evaporation. A variety of films, typically polyethylene terephthalate films may be used. Also useful are the materials disclosed in Japanese Patent Application Kokai No. 10315/1988. The dimensions of the substrate including thickness may be determined in accordance with the intended application.

The magnetic layer formed on the non-magnetic substrate are composed of at least two thin films of cobalt base ferromagnetic metal formed by the oblique evaporation method. Preferably for the evaporation of ferromagnetic metal thin films, θmax is from 80 to 90 degrees and θmin is from 10 to 60 degrees.

It is to be noted that the calculation of Δθ is based on absolute magnitudes of θmax and θmin. Actually, if θmax and θmin for the first ferromagnetic metal thin film are of positive values, then θmax and θmin for the second ferromagnetic metal thin film are of negative values. This is because ferromagnetic metal is evaporated so that the incident directions of ferromagnetic metal for the layers of the first and second ferromagnetic metal thin films intersect a normal to the substrate surface from opposite sides. More particularly, the growth direction of ferromagnetic metal columnar grains in the layers of the first ferromagnetic metal thin film intersects a normal to the substrate surface from one side, and the growth direction of ferromagnetic metal columnar grains in the layers of the second ferromagnetic metal thin film intersects the same normal from the other side. This structure of oppositely oriented layers is obtained by reversing the feed direction of the non-magnetic substrate between the first and second phases of evaporation.

The number of ferromagnetic metal thin films is not particularly limited. Two, three, four or more films may be stacked to form the desired magnetic layer. The order of stacking a plurality of ferromagnetic metal thin films is not particularly limited. More particularly, the first and second ferromagnetic metal thin films may be stacked in any desired order. That is, in the case of two layer structure, either of the first and second ferromagnetic metal thin films may overly another independent of the medium feed direction. In the case of three or more layer structure, most often the first and second ferromagnetic metal thin films are alternately stacked.

According to the feature of the present invention, the total thickness of the first ferromagnetic metal thin film is 0.7 to 1.3 times, preferably 0.8 to 1.2 times the total thickness of the second ferromagnetic metal thin film, and the sum of $t \cdot \Delta \theta$ of the respective layers constituting the first ferromagnetic metal thin film is 0.7 to 1.3 times, preferably 0.8 to 1.2 times the sum of $t \cdot \Delta \theta$ of the respective layers constituting the second ferromagnetic metal thin film, provided that the layers constituting the first and second ferromagnetic metal thin films each have a thickness t. (If a thin film consists of a single layer, its total thickness is equal to the thickness of the layer. If a thin film consist of two or more layers, its total thickness is equal to the sum of the thicknesses of two or more layers.)

By controlling the stack of ferromagnetic metal thin films in this way, reproduced waveforms are improved in symmetry, reduced in distortion and become consistent even when recording and reproducing directions are reversed.

The ferromagnetic metal thin films making up the magnetic layer is of a cobalt base metal, preferably a Co-Ni alloy, more preferably a Co-Ni alloy consisting essentially of about 80 mol % of C and about 20% of Ni. The Co base alloys may contain up to 10% of Cr as well as the metal elements described in Japanese Patent Application Kokai No. 10315/1988.

If desired, a minor proportion of oxygen may be introduced into each constituent layer near its surface or a non-magnetic layer may be interposed between constituent layers for the purpose of improving corrosion resistance.

Each of the ferromagnetic metal thin films preferably has a thickness of about 300 to about 1,500 Å. The total thickness of ferromagnetic metal thin films, that is, the thickness of the entire magnetic layer is preferably about 1,200 to about 3,000 Å. Higher outputs are obtained within this thickness range.

Each of the ferromagnetic metal thin films is formed by the oblique evaporation process. The process and apparatus of oblique evaporation are described in the literature and many patents.

For example, oblique evaporation is carried out by heating at least one stationary metal source to produce metal vapor while unwinding a non-magnetic substrate in the form of a length of film from a supply roll, feeding it along the circumferential surface of a rotating chill drum, and taking up it on a take-up roll. Metal vapor deposits on the substrate when the substrate moves along the circumferential path. The incident angle continuously varies from θmax at the start to θmin at the end of evaporation, resulting in columnar grains of cobalt base ferromagnetic metal archwise grown in an outward direction from the substrate and closely arranged on the substrate.

A magnetic layer of two or more ply structure is obtained by repeating this procedure. A magnetic layer of two ferromagnetic metal thin films in which the incident directions of ferromagnetic metal for the ferromagnetic metal thin films intersect a normal to the substrate surface from opposite sides is obtained by reversing the feed direction of the non-magnetic substrate between the first and second phases of evaporation.

If desired, any of various well-known topcoats may be provided on the magnetic layer of the magnetic recording medium according to the present invention for the purposes of protecting the magnetic layer and improving corrosion resistance. Also, any of various well-known backcoats may be provided on the surface of the substrate remote from the magnetic layer for the purpose of ensuring smooth tape travel.

The magnetic recording medium of the invention generally has a coercive force Hc of about 800 to about 1700 Oe, a residual magnetic flux density Br of about 2,500 to about 5,000 G, and a maximum magnetic flux density Bm of about 3,000 to 7,000 G in a tape longitudinal direction.

A series of positive and negative solitary wave pulsed signals (e.g., of rectangular wave) having a half value width of 50 to 500 nsec. and a recording wavelength of 0.35 to 0.80 μm. are recorded in the medium with optimum recording current flow and then reproduced. For the waveforms reproduced, the time from the zero cross point to the peak point (often referred to as rise time) should preferably be 0.5 to 2 times, more preferably 0.8 to 1.5 times the time from the peak point to the zero cross point (often referred to as fall time). The optimum recording current flow is a recording current flow from which a maximum output is available.

Using a head tester of the stationary head type, solitary wave signals as defined above are recorded with optimum recording current flow while moving the medium in forward and reverse directions and then reproduced while moving the medium in forward and reverse directions. Then there are reproduced four different waveforms depending on a combination of recording and reproducing directions. When these reproduced waveforms are laid one on another, the overlap of more than zero peaks between the reproduced waveforms should preferably be at least 70%, more preferably at least 80%, most preferably 90 to 100%.

In this way, reproduced waveforms become more symmetric, less distorted and consistent upon reversal of recording and reproducing directions between forward and reverse directions. As a consequence, a lower error rate and a higher S/N ratio are achieved. Equalization becomes easy or is even eliminated. Interchangeability with other types of tape is improved.

Digital recording and reproducing operations may be carried out on the medium of the invention in any desired well-known format in accordance with the teachings of the previously cited references. The recording signals used herein generally have a half value width of about 50 to about 500 nsec. and a recording wavelength of about 0.35 to about 0.80 μm.

EXAMPLE

Examples of the first form of the present invention are given below by way of illustration and not by way of limitation.

EXAMPLE 1

A first phase of oblique evaporation was carried out by evaporating 20 at % Ni-Co alloy in an argon gas atmosphere at $10^{-4}$ Torr, raveling a polyethylene terephthalate (PET) film of 7 μm thick from its supply roll, feeding the film along the circumference of a rotating cylindrical chill drum whereby the cobalt alloy was deposited on the film to form a lower ferromagnetic metal thin film, and reeling up the film on a take-up roll.

A second phase of oblique evaporation was carried out by reversing the film feed direction, that is, using the take-up roll as a supply roll. The cobalt alloy was deposited on the lower ferromagnetic metal thin film in an incident direction crossing the incident direction associated with the first phase of deposition with respect to a normal to the PET film surface, forming an upper ferromagnetic metal thin film. There was obtained a magnetic recording medium having a magnetic layer of two layer structure.

During evaporation of both the upper and lower ferromagnetic metal thin films, θmin was 40° and θmax was 90°. Then $\Delta\theta_u$ of the upper layer and $\Delta S1$ of the lower layer are both equal to 50°. The upper layer had a thickness $t_u$ of 1000 Å and the lower layer had a thickness $t_1$ of 1000 Å.

Then, $t_1/t_u=1$ and $t_1 \cdot \Delta\theta 1/t_u \cdot \Delta\theta_u=1$.

The sample was slit to strips of 8 mm wide, from which video cassettes were fabricated.

For comparative purposes, a comparative cassette was fabricated by evaporating the 20 at % Ni-Co alloy at θmin= 40° and θmax=90° to a thickness of 2000 Å, forming a ferromagnetic metal thin film of a single layer structure.

A digital recording machine having a MIG head build therein (Model S900 manufactured by Sony K. K.) was loaded with each cassette for recording positive and negative solitary rectangular wave signals of 1 MHz with optimum recording current flow and reproducing the signals to measure the zero cross-to-peak time Tr and peak-to-zero cross time Tf of reproduced solitary waveforms.

Using a drum head tester, the same solitary rectangular wave signals were recorded with optimum recording current flow while moving the tape in forward and reverse directions and then reproduced while moving the tape in forward and reverse directions. Four different waveforms were measured by means of a digital oscilloscope and printed out by means of a plotter after sixteen waveforms were averaged for each type. These plots were laid one on another. The overlap of more than zero peaks between the reproduced waveforms was determined. The minimum overlapping area is reported as overlap.

The results are shown in Table 1.

TABLE 1

| Cassette | Tr/Tf | Overlap (%) |
| --- | --- | --- |
| Invention | 1.5/1 | 95 |
| Comparison | 3/1 | 60 |

Using a modified digital audio tape recorder, the cassette tapes were measured for error rate. The error rate of the cassette of Example 1 was $10^{-5}$ and the error rate of the comparative cassette was $10^{-4}$.

The magnetic recording medium of the present invention is suited for digital recording since a low error rate, a high S/N ratio and simple equalization are achieved, and improved interchangeability with other types of medium is expectable.

Second embodiment

In a second form of the magnetic recording medium for digital recording according to the present invention, a magnetic layer is on a surface of a non-magnetic substrate. The magnetic layer includes ferromagnetic metal thin films of columnar grains deposited by oblique evaporation process.

Figure 1:
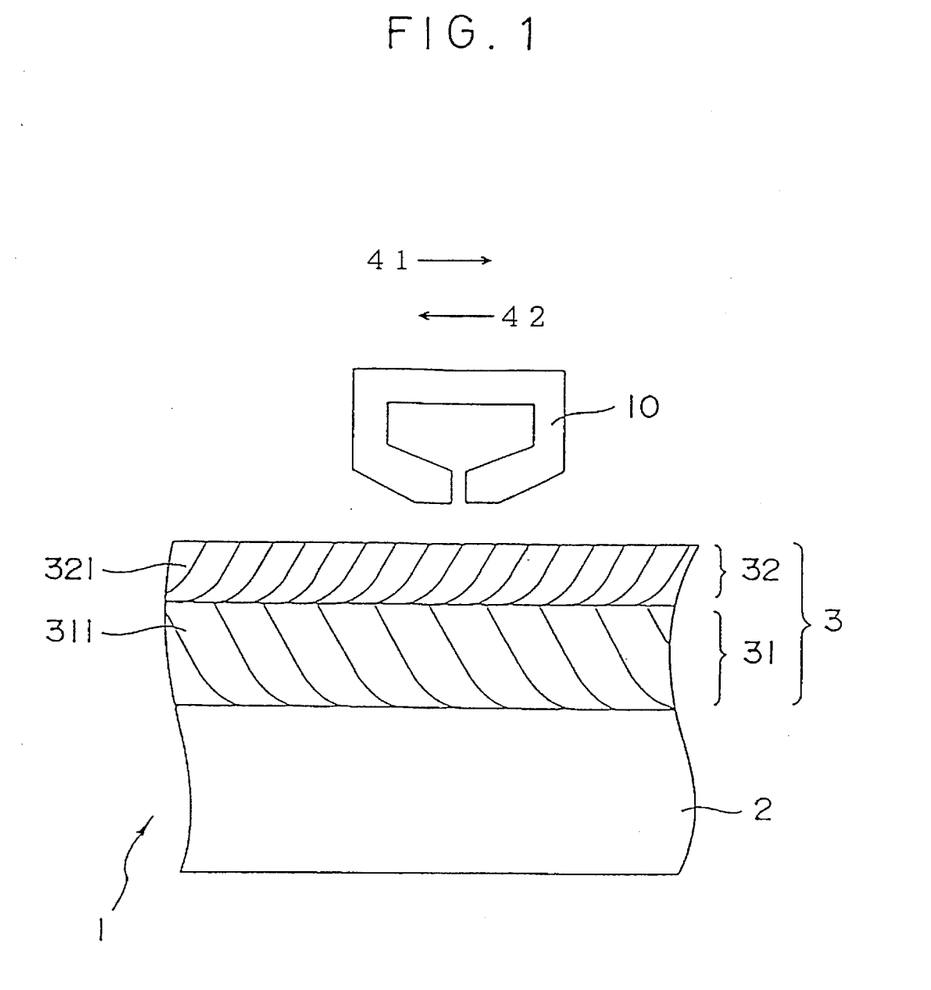
FIG. 1 is a fragmental cross section of a magnetic recording medium for digital recording according to the second and third embodiments of the invention, showing a magnetic head in relative motion to the growth direction of columnar grains in the upper layer.

Referring to FIG. 1, the magnetic recording medium for digital recording generally designated at 1 has a magnetic layer 3 on one major surface of a substrate 2. The magnetic layer 3 includes a lower layer 31 consisting of one retromagnetic metal thin film nearer to the substrate surface and an upper layer 32 consisting of one ferromagnetic metal thin film. The ferromagnetic metal thin films 31 and 32 are composed of columnar grains 311 and 321 deposited on the substrate 2 in this order by oblique evaporation process. The average growth direction of columnar grains 311 in the lower layer 31 and the average growth direction of columnar grains 321 in the upper layer 32 intersect each other from opposite sides of a normal to the substrate surface.

The situation is the same when the lower and/or upper layer consists of a plurality of ferromagnetic metal thin films. That is, the average growth direction of columnar grains in the respective ferromagnetic metal thin films belonging to the lower layer and the average growth direction of columnar grains in the respective ferromagnetic metal thin films belonging to the upper layer intersect each other from opposite sides of a normal to the substrate surface. The embodiment wherein the lower and/or upper layer consists of a plurality of ferromagnetic metal thin films results in improved S/N since the columnar grains in the respective ferromagnetic metal thin films can have reduced grain size.

In FIG. 1, a magnetic head 10 is in relative motion to the magnetic recording medium 1 during recording and reproducing operations. The magnetic head 10 is in relative motion toward the growth direction of columnar grains in the upper layer 32 as shown by an arrow 41. Toward the growth direction of columnar grains is substantially coincident with the direction given by projecting the growth direction of columnar grains on the substrate major surface. When the magnetic recording medium in the form of magnetic tape is subject to ordinary helical scan recording, the relative moving direction of the head is generally in alignment with the projection direction of columnar grain growth within about ±10° in the substrate major surface plane.

The thickness of the lower layer 31 is 1.2 to 5.0 times, preferably 1.5 to 4.0 times the thickness of the upper layer 32. When the magnetic head is in relative motion toward the growth direction of columnar grains in the upper layer 32, reproduced waveforms are improved in symmetry by controlling the thickness of the lower and upper layers 31 and 32 to this range. More particularly, with this thickness control, when a series of positive and negative solitary wave pulsed signals (e.g., of rectangular wave) having a half value width of 50 to 500 nsec. and a recording wavelength of 0.35 to 0.80 μm. are recorded in the medium with optimum recording current flow and then reproduced, the time from the zero cross point to the peak point (often referred to as rise time) of a waveform reproduced can be 0.5 to 1.5 times, more preferably 0.8 to 1.2 times the time from the peak point to the zero cross point (often referred to as fall time). The optimum recording current flow is a recording current flow from which a maximum output is available. Less benefits are obtained when the lower layer thickness is less than 1.2 times the upper layer thickness. When the lower layer thickness is more than 5 times the upper layer thickness, the upper layer would be too thin to provide strength or outputs.

Preferably the magnetic layer (including the first and second layers) has a total thickness of about 1000 to about 3000 Å, preferably about 1500 to about 2500 Å. Below this range, the magnetic layer as a whole is less strong and less reliable. Beyond this range, recording magnetization would induce a rotating mode, resulting in lower reproduction outputs.

Where the lower and/or upper layer consists of a plurality of ferromagnetic metal thin films, the thickness of each thin film is not particularly limited as long as the upper-to-lower layer thickness ratio is met. Therefore, the thickness of each thin film may be determined in accordance with the total thickness of the magnetic layer and the number of thin films stacked.

The gradient of columnar grains in each ferromagnetic metal thin film is not particularly limited. A suitable gradient may be chosen in accordance with the desired in-plane coercive force and residual magnetic density as well as the location of the relevant ferromagnetic metal thin film in the magnetic layer. For high coercive force and high residual magnetic density, the angle A between the average growth direction of columnar grains and the substrate major surface should preferably range from 40° to 80°, more preferably from 50° to 70°. Where the lower and/or upper layer consists of a plurality of ferromagnetic metal thin films, the average growth directions of the respective ferromagnetic metal thin films belonging to the same layer need not be coincident, and the respective ferromagnetic metal thin films may have different angles A in accordance with the signal pattern recording depth or the like.

The angle A between the average growth direction of columnar grains and the substrate major surface is determined as follows. First, the medium is sectioned along a plane containing the growth direction of columnar grains and perpendicular to the substrate major surface. In the section, the columnar grains constituting each ferromagnetic metal thin film appear in arcuate shape as shown in FIG. 1. For at least 100 columnar grains in each ferromagnetic metal thin film, the angle between the side of a columnar grain appearing in this section (the boundary between adjoining columnar grains) and the substrate major surface is measured at an intermediate point in thickness direction of the thin film. An average angle for each thin film is then calculated. This average angle is the angle A between the average growth direction of columnar grains and the substrate major surface for each ferromagnetic metal thin film.

The angle A depends on the incident direction of ferromagnetic metal during oblique evaporation, especially on the minimum incident angle θmin.

The ferromagnetic metal thin films making up the magnetic layer is of a cobalt base metal, preferably an alloy containing at least 60 atom% of cobalt. Preferred cobalt base alloys are Co-Ni alloys and Co-Ni-Cr alloys while the content of alloying elements such as Ni, Cr and the like may be determined in accordance with the desired magnetic properties and corrosion resistance.

The magnetic properties of the magnetic layer are not particularly limited and desired magnetic properties may be obtained by a suitable choice of the magnetic layer composition, columnar grain growth direction and other factors. For high density digital recording, the magnetic layer should preferably have a coercive force Hc of about 800 to about 1700 Oe, a residual magnetic flux density Br of about 2,500 to about 5,000 G, and a maximum magnetic flux density Bm of about 3,000 to 7,000 G in the plane of the magnetic layer.

Oblique evaporation is carried out, for example, by heating at least one stationary metal source to produce metal vapor while unwinding a non-magnetic substrate in the form of a length of film from a supply roll, feeding it along the circumferential surface of a rotating chill drum, and taking up it on a take-up roll. Metal vapor deposits on the substrate when the substrate moves along the circumferential path. The incident angle continuously varies from θmax at the start to θmin at the end of evaporation, resulting in columnar grains of cobalt base ferromagnetic metal archwise grown in an outward direction from the substrate and closely arranged on the substrate. An upper layer may be deposited on the underlying layer by using the take-up roll for the underlying layer as a supply roll whereby the substrates is moved in a reverse direction during evaporation. The maximum and minimum incident angles θmax and θmin may be suitably determined in accordance with desired magnetic properties although θmax=about 80° to 90° and θmin=about 10° to 60° are preferred. Preferably, oxygen gas is introduced in the evaporating atmosphere for increasing the coercive force and stability against oxidation.

The non-magnetic substrate used herein may be formed of any desired non-magnetic material which can withstand heat encountered during formation of ferromagnetic metal thin films by evaporation. A variety of films, typically polyethylene terephthalate films may be used. Also useful are the materials disclosed in Japanese Patent Application Kokai No. 10315/1988. The dimensions of the substrate including thickness may be determined in accordance with the intended application.

Preferably, the major surface of the substrate on which the magnetic layer is deposited is provided with fine protrusions. Since the magnetic layer is a very thin film evaporated on the substrate, the physical state of the substrate surface is directly reflected by the magnetic layer surface. Therefore, the provision of fine protrusions of the substrate surface results in a magnetic layer having fine protrusions on its surface. Such fine protrusions on the magnetic layer surface are effective in reducing friction for improving tape travel and increasing the medium durability.

The configuration and formation of fine protrusions on the substrate surface are not critical. Preferably, fine particles are distributed on the substrate surface to provide fine protrusions since the protrusion distribution pattern and surface roughness of the substrate after protrusion formation affect the magnetic properties, especially coercive force of the magnetic layer.

The fine particles used herein are preferably of particulate, especially spherical shape. Useful are inorganic particles containing at least one of oxides and salts of metals such as Si, Al, Mg, Ca, Ba, Zn, and Mn, for example, oxides such as $SiO_2$, $Al_2O_3$, MgO, ZnO, $MgCO_3$, $CaCO_3$, $CaSO_4$, $BaSO_4$, and $TiO_2$, sulfates, and carbonates, as well as spherical particles of organic compounds such as polystyrene, polyesters, polyamides, and polyethylene. The fine particles may be either magnetic or non-magnetic.

Preferably, the fine particles have a mean particle size of about 100 to about 1,000 Å, more preferably from about 300 to about 600 Å. Finer particles of a size below this range would be less effective for friction reduction. Coarse particles of a size beyond this range would cause the magnetic layer to have a too large surface roughness to achieve a desired center line average roughness Ra, resulting in losses of coercive force and high-frequency response.

Fine particles are preferably distributed at a population of 100,000 to 100,000,000 particles/mm$^2$, especially 1,000,000 to 70,000,000 particles/mm$^2$. The benefit of providing fine particles would be lost with a distribution population below this range. A distribution population beyond this range would achieve no further improvement and make it difficult to achieve the desired coalescence factor mentioned below.

It is preferred that fine particles be distributed as uniformly as possible. If particles coalesce or approach too closely, they would undesirably behave as apparently larger particles (secondary particles). The degree of approach between fine particles is defined herein as coalescence factor, which is given by:

Coalescence factor=(number per unit area of particles meeting d<R)/(number per unit area of particles) ×100% wherein R is an average diameter of particles distributed on the substrate surface and d is the distance between adjoining particles. It will be understood that the particle-to-particle distance d and the number of particles are determined by means of an electron microscope.

According to the invention, the coalescence factor is preferably up to 70%, especially 0 to 60%. At coalescence factors of more than 70%, many fine particles would behave as secondary particles, disturbing the alignment of columnar grain growth direction, resulting in a loss of coercive force. In addition, after a magnetic layer is formed, protrusions of larger diameter and height would appear on the magnetic layer surface so that the magnetic layer surface property is degraded, resulting in a spacing loss and a lowering of electromagnetic properties therewith.

After fine particles are distributed, the substrate should preferably have a center line average roughness Ra of up to 40 Å, especially up to 30 Å. Ra in excess of this limit would disturb the alignment of columnar grain growth direction, resulting in a loss of coercive force. The lower limit of Ra is 10 Å because with too low Ra values, friction reduction and durability improvement would be insufficient.

It is not critical how to distribute fine particles on the substrate surface. Fine particles may be distributed on a substrate by dissolving a synthetic resin in a solvent to form a binder, dispersing fine particles in the binder, and applying the dispersion to the substrate or by dissolving a synthetic resin in a solvent to form a binder, applying the binder to the substrate, and attaching fine particles to the binder coating.

If desired, any of various well-known topcoats may be provided on the magnetic layer of the magnetic recording medium according to the present invention for the purposes of protecting the magnetic layer and improving corrosion resistance. Also, any of various well-known backcoats may be provided on the back surface of the substrate remote from the magnetic layer for the purpose of ensuring smooth tape travel.

Digital recording and reproducing operations may be carried out on the medium of the invention in any desired well-known format in accordance with the teachings of the previously cited references. The recording signals used herein generally have a half value width of about 50 to about 500 nsec. and a recording wavelength of about 0.35 to about 0.80 μm.

The magnetic recording medium for digital recording according to the invention is generally in the form of tape meeting the standard of a particular application.

Third embodiment

The third form of the magnetic recording medium for digital recording according to the present invention is substantially the same as the second form except that the motion of the magnetic head relative to the medium is reversed.

Referring to FIG. 1, the magnetic recording medium for digital recording generally designated at 1 has a magnetic layer 3 on one major surface of a substrate 2. The magnetic layer 3 includes a lower layer 31 consisting of one ferromagnetic metal thin film nearer to the substrate surface and an upper layer 32 consisting of one ferromagnetic metal thin film. The ferromagnetic metal thin films 31 and 32 are composed of columnar grains 311 and 321 deposited on the substrate 2 in this order by oblique evaporation process. The average growth direction of columnar grains 311 in the lower layer 31 and the average growth direction of columnar grains 321 in the upper layer 32 intersect each other from opposite sides of a normal to the substrate surface. The situation is the same when the lower and/or upper layer consists of a plurality of ferromagnetic metal thin films.

In FIG. 1, a magnetic head 10 is in relative motion to the magnetic recording medium 1 during recording and reproducing operations. The magnetic head 10 is in relative motion opposite to the growth direction of columnar grains in the upper layer 32 as shown by an arrow 42. Opposite to the growth direction of columnar grains is substantially inverse to the direction given by projecting the growth direction of columnar grains on the substrate major surface. When the magnetic recording medium in the form of magnetic tape is subject to ordinary helical scan recording, the relative moving direction of the head is generally in alignment with the inverse of the projection direction of columnar grain growth within about ±10° in the substrate major surface plane.

When the magnetic head is in relative motion opposite to the growth direction of columnar grains in the upper layer 32 during recording, reproduced waveforms are improved in symmetry. More particularly, when a series of positive and negative solitary wave pulsed signals (e.g., of rectangular wave) having a half value width of 50 to 500 nsec. and a recording wavelength of 0.35 to 0.80 μm are recorded in the medium with optimum recording current flow and then reproduced, the time from the zero cross point to the peak point (rise time) of a waveform reproduced can be 0.5 to 1.5 times, more preferably 0.8 to 1.2 times the time from the peak point to the zero cross point (fall time).

In the third form, the thickness ratio of the lower layer 31 to the upper layer 32 is not restrictive as in the second form. As the lower layer becomes thicker, higher outputs are obtained, but waveforms become less symmetric. A proper design should be determined in accordance with a recording format while taking into account the correlation of output and waveform symmetry. Often, the thickness of the lower layer 31 is about 0.5 to about 5.0 times the thickness of the upper layer 32. Lower outputs are obtained when the lower layer thickness is less than one-half of the upper layer thickness. When the lower layer thickness is more than 5 times the upper layer thickness, the upper layer would be too thin to provide strength or outputs. The thickness of the lower layer 31 is about 0.5 to about 2.0 times, especially about 0.8 to about 1.4 times the thickness of the upper layer 32 when the waveform symmetry is of greater interest, and about 1.2 to about 5.0 times, especially about 1.5 to about 4.0 times the thickness of the upper layer 32 when the output is of greater interest.

The remaining factors are the same as in the second form.

EXAMPLE

Examples of the second and third forms of the present invention are given below by way of illustration and not by way of limitation.

EXAMPLE 2

A fine particle suspension was prepared by adding 0.15% by weight of $SiO_2$ particles having a mean particle size of 300 Å, 0.2% by weight of methyl cellulose as a binder, 0.02% by weight of N-β-(aminoethyl)-γ-aminopropylmethyldimethoxysilane as a silane coupling agent to water and thoroughly dispersing the blend. The suspension was applied to one surface of a PET film of 7 μm. After drying, the substrate having fine particles distributed thereon had a distribution population of 10,000,000 particles/mm², a coalescence factor of 50%, and a Ra of 30 Å on the surface.

Next, ferromagnetic metal thin films were deposited on the substrate surface by oblique evaporation.

A first phase of oblique evaporation was carried out by admitting a gas mix of argon and oxygen into a vacuum chamber to keep the atmosphere at $10^{-4}$ Tort, evaporating a 20 at % Ni-80 at % Co alloy in the chamber, raveling the particle-bearing PET film from its supply roll, feeding the film along the circumference of a rotating cylindrical chill drum whereby the cobalt alloy or ferromagnetic metal was deposited on the film to form a lower layer, and reeling up the film on a take-up roll. The gas mix was admitted so as to blow against the substrate film where the ferromagnetic metal was deposited near the minimum incident angle.

A second phase of oblique evaporation was carried out by reversing the film feed direction, that is, using the take-up roll as a supply roll. The cobalt alloy or ferromagnetic metal was deposited on the lower layer in an incident direction crossing the incident direction associated with the first phase of deposition with respect to a normal to the PET film surface, forming an upper layer. There was obtained a magnetic recording medium having a magnetic layer of two layer structure.

During evaporation of both the upper and lower ferromagnetic metal thin films, θmax was 90° and θmin was 35°.

A series of samples were prepared by changing the thickness $t_1$ of the lower layer relative to the thickness $t_u$ of the upper layer. The angle A between the average growth direction of columnar grains and the substrate major surface was 55° for both the lower and upper layers. The angle A was determined as previously described by repeating measurement for 100 columnar grains. The lower and upper layers had a total thickness of 2000 Å.

Each sample was slit to strips of 8 mm wide, from which video cassettes were fabricated such that the motion of a magnetic head relative to the tape might be toward the growth direction of columnar grains in the upper layer.

A digital recording video deck having a MIG head build therein (Model S900 manufactured by Sony K. K.) was loaded with each cassette for recording positive and negative solitary rectangular wave signals of 1 MHz with optimum recording current flow and reproducing the signals to measure the zero cross-to-peak time Tr and peak-to-zero cross time Tf of reproduced solitary waveforms. The ratio Tr/Tf is plotted as a function of recording current flow (dBm) in FIG. 2.

Separately, each sample was tested by recording sine wave signals of 10 MHz and measuring the output of reproduced signals. The output is plotted as a function of recording current flow (dBm) in FIG. 3.

Figure 2:
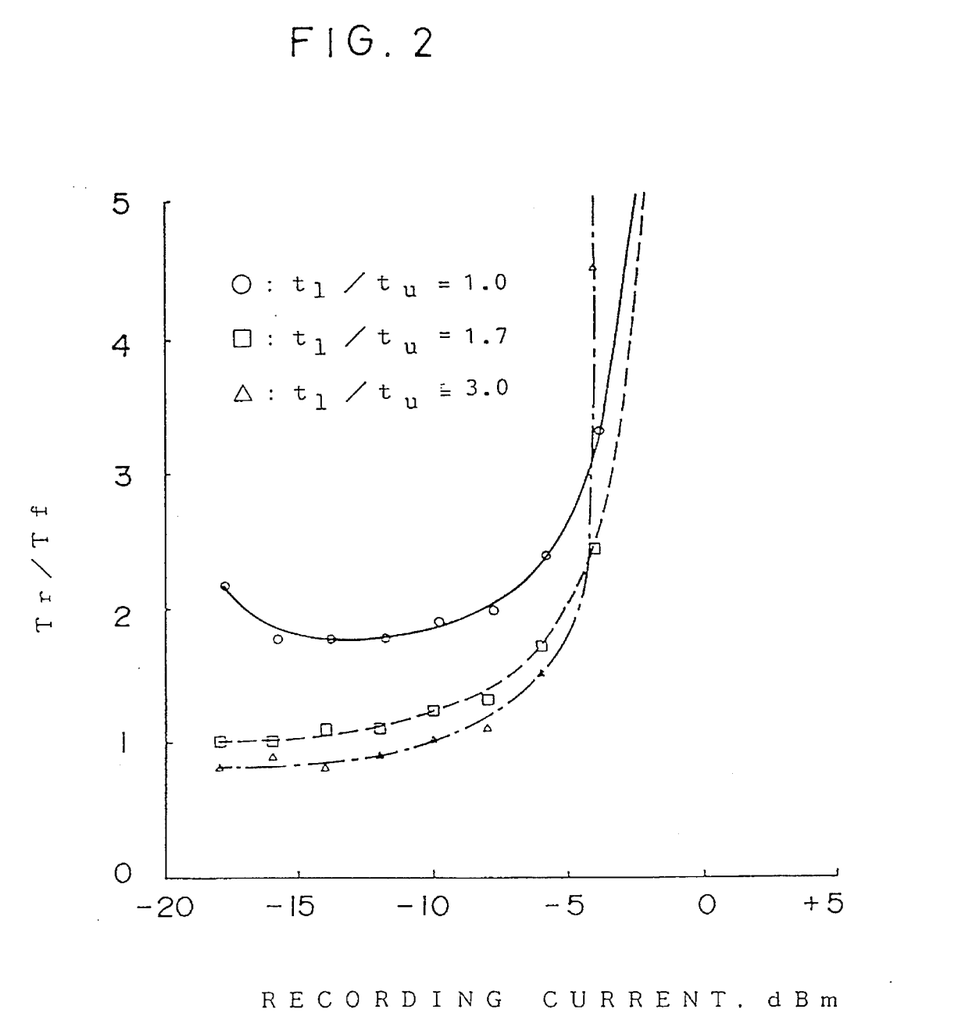
FIG. 2 is a graph showing the Tr/Tf of Example 2 samples relative to recording current.
Figure 3:
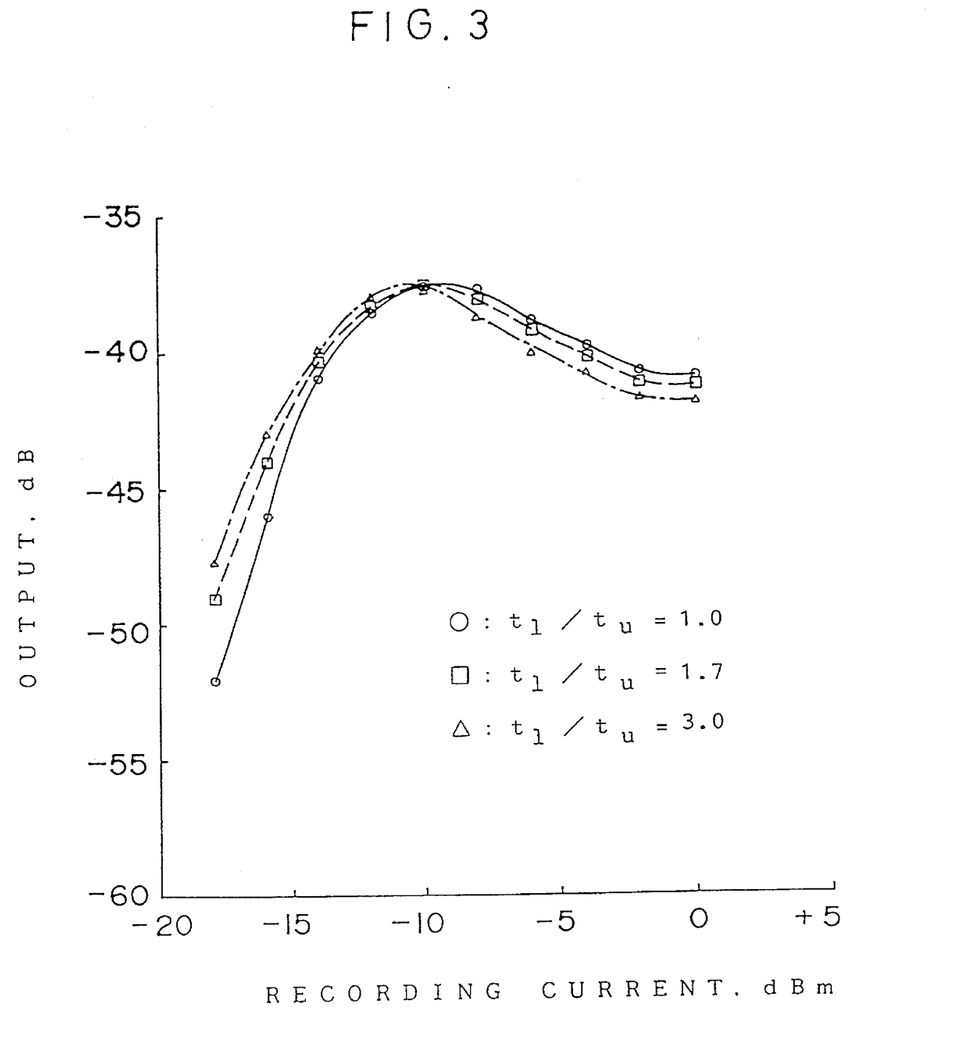
FIG. 3 is a graph showing the output of Example 2 samples relative to recording current.

The benefits of the present invention are evident from FIGS. 2 and 3. As compared with the comparative sample having a lower layer thickness equal to an upper layer thickness, the samples of the invention having a lower-to-upper layer thickness ratio $t_1/t_u$ of from 1.2 to 5.0 showed a Tr/Tf approaching to 1, especially a Tr/Tf of about 1 to 1.2 with the optimum recording current flow (−10 dBm), indicating the improved symmetry of solitary reproduced waveforms. The Tr/Tf falls within the range of 0.8 to 1.5 over a wide recording current flow range of from −20 to −7 dBm, allowing a high degree of freedom for circuitry design with an advantage of interchangeability. It is to be understood that dBm represents an electric power level, with a power of 1 mW corresponding to 0 dBm. FIG. 3 shows that the inventive samples reproduced substantially equivalent outputs to the comparative sample.

The samples had a coercive force of about 1,200 Oe in a magnetic layer in-plane direction, a residual magnetic flux density Br of about 4,500 G, and a squareness ratio of about 0.78.

Using a modified digital audio tape (DAT) recorder, the cassette tapes were measured for error rate. The error rate of the inventive samples was lower by two or more orders than that of the comparative sample.

EXAMPLE 3

A fine particle suspension was prepared by adding 0.15% by weight of $SiO_2$ particles having a mean particle size of 300 Å, 0.2% by weight of methyl cellulose as a binder, 0.02% by weight of N-β-(aminoethyl)-γ-aminopropylmethyldimethoxysilane as a silane coupling agent to water and thoroughly dispersing the blend. The suspension was applied to one surface of a PET film of 7 pm. After drying, the substrate having fine particles distributed thereon had a distribution population of 10,000,000 particles/mm², a coalescence factor of 50%, and a Ra of 30 Å on the surface.

Next, ferromagnetic metal thin films were deposited on the substrate surface by oblique evaporation.

A first phase of oblique evaporation was carried out by admitting a gas mix of argon and oxygen into a vacuum chamber to keep the atmosphere at $10^{-4}$ Tort, evaporating a 20 at % Ni-80 at % Co alloy in the chamber, raveling the particle-bearing PET film from its supply roll, feeding the film along the circumference of a rotating cylindrical chill drum whereby the cobalt alloy or ferromagnetic metal was deposited on the film to form a lower layer, and reeling up the film on a take-up roll. The gas mix was admitted so as to blow against the substrate film where the ferromagnetic metal was deposited near the minimum incident angle.

A second phase of oblique evaporation was carried out by reversing the film feed direction, that is, using the take-up roll as a supply roll. The cobalt alloy or ferromagnetic metal was deposited on the lower layer in an incident direction crossing the incident direction associated with the first phase of deposition with respect to a normal to the PET film surface, forming an upper layer. There was obtained a magnetic recording medium having a magnetic layer of two layer structure.

During evaporation of both the upper and lower ferromagnetic metal thin films, 8max was 90° and θmin was 35°.

A series of samples were prepared by changing the thickness $t_1$ of the lower layer relative to the thickness $t_u$ of the upper layer. The angle A between the average growth direction of columnar grains and the substrate major surface was 55° for both the lower and upper layers. The angle A was determined as previously described by repeating measurement for 100 columnar grains. The lower and upper layers had a total thickness of 2000 Å.

Each sample was slit to strips of 8 mm wide, from which video cassettes were fabricated such that the motion of a magnetic head relative to the tape might be opposite to the growth direction of columnar grains in the upper layer.

For comparison purposes, there were also fabricated video cassettes in which the motion of a magnetic head relative to the tape might be toward the growth direction of columnar grains in the upper layer. (This comparative sample corresponds to the comparative sample in Example 2 having a $t_1/t_u$ ratio of 1.0.)

A digital recording video deck having a MIG head build therein (Model S900 manufactured by Sony K. K.) was loaded with each cassette for recording positive and negative solitary rectangular wave signals of 1 MHz with optimum recording current flow and reproducing the signals to measure the zero cross-to-peak time Tr and peak-to-zero cross time Tf of reproduced solitary waveforms. The ratio Tr/Tf is plotted as a function of recording current flow (dBm) in FIG. 4.

Separately, each sample was tested by recording sine wave signals of 10 MHz and measuring the output of reproduced signals. The output is plotted as a function of recording current flow (dBm) in FIG. 5.

Figure 4:
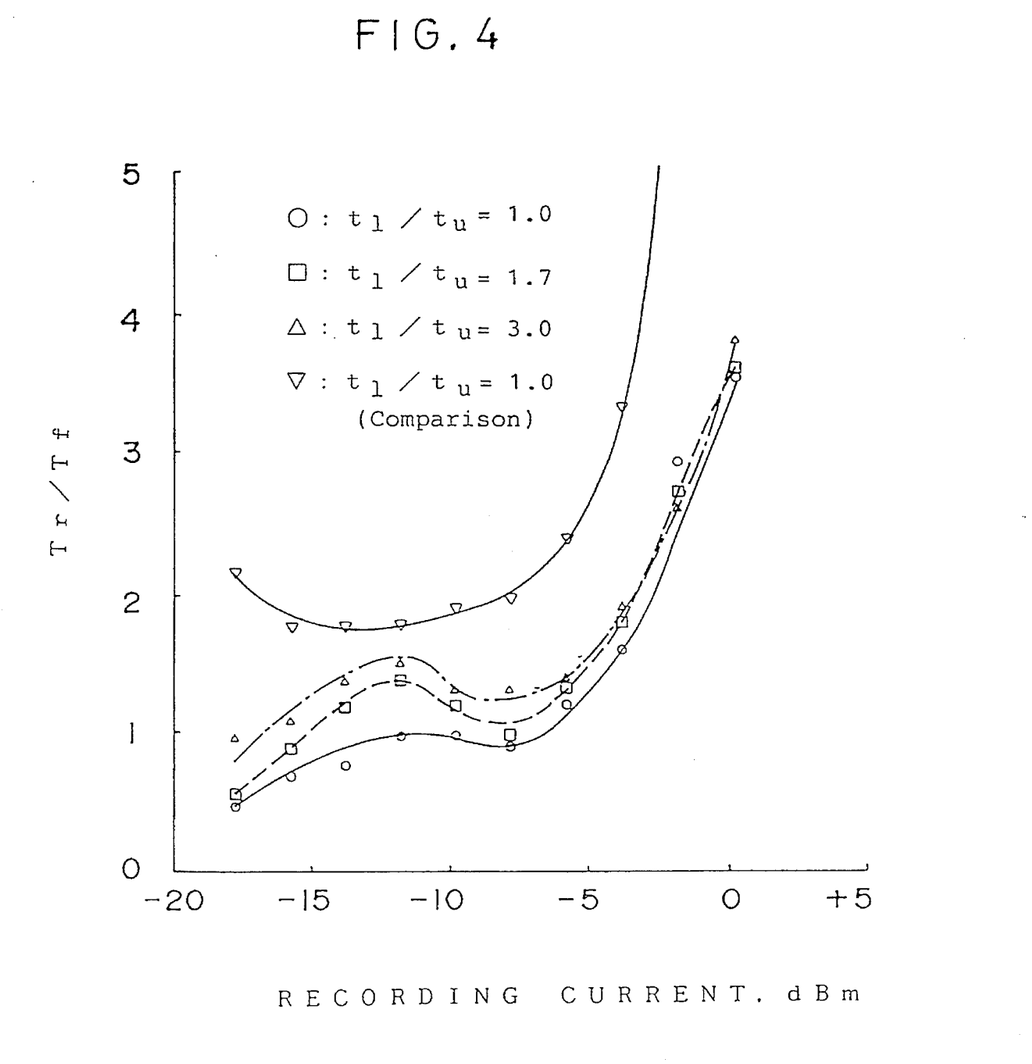
FIG. 4 is a graph showing the Tr/Tf of Example 3 samples relative to recording current.
Figure 5:
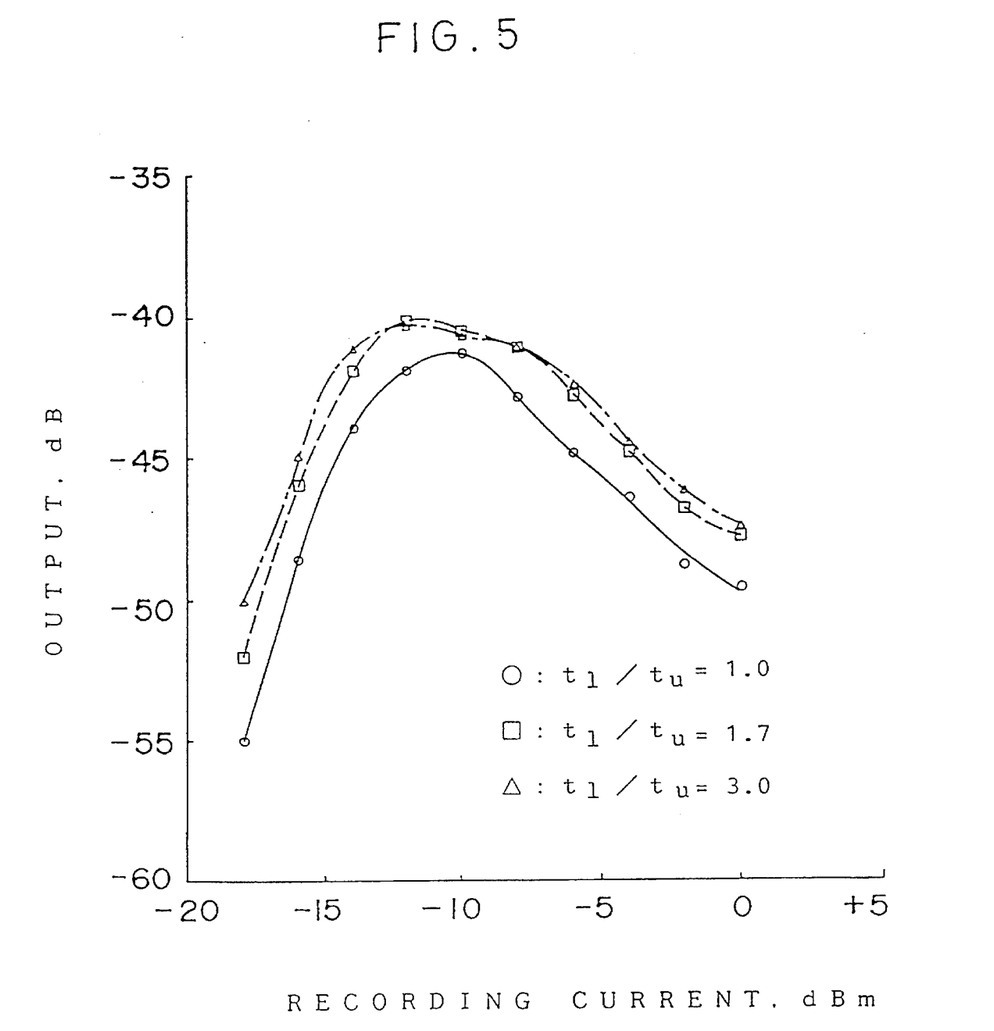
FIG. 5 is a graph showing the output of Example 3 samples relative to recording current.

The benefits of the present invention are evident from FIGS. 4 and 5. As compared with the comparative sample in which the magnetic head is in relative motion toward the grain growth direction, the samples of this example in which the magnetic head is in relative motion opposite to the grain growth direction showed a Tr/Tf approaching to 1, especially a Tr/Tf of about 0.8 to 1.5 near the optimum recording current flow (from −12 to −10 dBm), indicating the improved symmetry of solitary reproduced waveforms. The Tr/Tf falls within the range of 0.8 to 1.5 over a wide recording current flow range of from −15 to −5 dBm, allowing a high degree of freedom for circuitry design with an advantage of interchangeability.

FIG. 5 shows that the output is increased with the increasing thickness of the lower layer. Tr/Tf approaches to 1 with the decreasing thickness of the lower layer.

The samples had a coercive force of about 1,200 Oe in a magnetic layer in-plane direction, a residual magnetic flux density Br of about 4,500 G, and a squareness ratio of about 0.78.

Using a modified digital audio tape (DAT) recorder, the cassette tapes were measured for error rate. The error rate of the inventive samples was fully low.

There has been described a magnetic recording medium suited for digital recording in which satisfactorily symmetric waveforms are reproduced, high outputs are achieved and the error rate is low. The window margin per unit waveform is narrow enough to enable short-wavelength recording, thus ensuring high density recording and high S/N ratio. Equalization is easy or eliminated, with improved interchangeability with coating type metal tape and other media.

While we have shown and described particular embodiments of our invention, it will be obvious to those skilled in the art that various changes and modifications may be made without departing from the invention in its broader aspects.

We claim:

1. A digital magnetic recording method comprising recording digital signals having a half value width of 50 to 500 nsec. and a recording wavelength of 0.35 to 0.80 μm on a magnetic layer on a surface of a non-magnetic substrate, wherein said magnetic layer has a coercive force of 800 to 1,700 Oe and includes a lower layer consisting of at least one ferromagnetic metal thin film nearer to the substrate surface and an upper layer consisting of at least one ferromagnetic metal thin film, each ferromagnetic metal thin film being composed of columnar grains deposited by oblique evaporation, wherein the average growth direction of columnar grains in said lower layer and the average growth direction of columnar grains in said upper layer intersect each other from opposite sides of a normal to the substrate surface, the thickness of said lower layer is 1.2 to 5.0 times the thickness of said upper layer, wherein digital recording is carried out by means of a magnetic head in relative motion toward the growth direction of columnar grains in said upper layer, and wherein when positive and negative solitary wave signals are recorded on said layer with optimum recording current flow and then reproduced, the time from the zero cross point to the peak point is 0.5 to 1.5 times the time from the peak point to the zero cross point of the reproduced signal.

2. The digital magnetic recording method of claim 1 having a residual magnetic flux density of at least 2,500 G in the plane of said magnetic layer.

3. A digital magnetic recording method comprising digital signals having a half value width of 50 to 500 nsec. and a recording wavelength of 0.35 to 0.80 μm on a magnetic layer arranged on a surface of a non-magnetic substrate, wherein said magnetic layer has a coercive force of 800 to 1,700 Oe and comprises a lower layer consisting of at least one ferromagnetic metal thin film nearer to the substrate surface and an upper layer consisting of at least one ferromagnetic metal thin film, each ferromagnetic metal thin film being composed of columnar grains deposited by oblique evaporation, wherein the average growth direction of columnar grains in said lower layer and the average growth direction of columnar grains in said upper layer intersect each other from opposite sides of a normal to the substrate surface, and wherein digital recording is carried out by means of a magnetic head in relative motion opposite to the growth direction of columnar grains in said upper layer, and wherein when positive and negative solitary wave signals are recorded on said magnetic layer with optimum recording current flow and then reproduced, the time from the zero cross point to the peak point is 0.5 to 1.5 times the time from a peak point to a zero cross point of the reproduced signal.

4. The digital magnetic recording method of claim 3 wherein when positive and negative solitary wave signals are recorded with optimum recording current flow and then reproduced, the time from a zero cross point to a peak point is 0.5 to 1.5 times the time from a peak point to a zero cross point of the reproduced signal.

5. The digital magnetic recording method of claim 3 having a residual magnetic flux density of at least 2,500 G in a plane of said magnetic layer.

6. A digital magnetic recording method using a magnetic recording medium having a magnetic layer disposed on a surface of a non-magnetic substrate, said method comprising digitally recording signals having a half value width of 50 to 500 nsec. and a recording wavelength of 0.35 to 0.80 μm on a magnetic layer, wherein in said magnetic recording medium, said magnetic layer comprises a first thin film consisting of at least one layer of cobalt base ferromagnetic metal formed by oblique evaporation in a first direction and a second thin film consisting of at least one layer of cobalt base ferromagnetic metal formed by oblique evaporation in a second direction which is different from the first direction; the angle included between the incident direction of ferrogmagnetic metal during evaporation and a normal to the surface of said non-magnetic substrate, designated incident angle, varies from a maximum incident angle θmax to a minimum incident angle θmin during oblique evaporation, Δθ=θmax−θmin, layers constituting said first and second ferromagnetic metal thin films each having a thickness t, the thickness of said first ferromagnetic metal thin film being 0.7 to 1.3 times the thickness of said second ferromagnetic metal thin film, the sum of t·Δθ of respective layers constituting said first ferromagnetic metal thin film being 0.7 to 1.3 times the sum of t·Δθ of the respective layers constituting said second ferromagnetic metal thin film; the magnetic layer having a coercive force of 800 to 1,700 Oe;

said recording medium further being characterized such that when positive and negative solitary wave signals are recorded thereon with optimum recording current flow and then reproduced, the time from a zero cross point to a peak point is 0.5 to 2 times the time from a peak point to a zero cross point of the reproduced signal, and when positive and negative solitary wave signals are recorded thereon with optimum recording current flow while moving the medium in forward and reverse directions and then reproduced while moving the medium in forward and reverse directions, the reproduced waveforms, when laid one upon another, overlap by at least 70%.

* * * * *

UNITED STATES PATENT AND TRADEMARK OFFICE
CERTIFICATE OF CORRECTION

PATENT NO. : 5,453,886
DATED : September 26, 1995
INVENTOR(S) : Koji Kobayashi et al.

It is certified that error appears in the above-indentified patent and that said Letters Patent is hereby corrected as shown below:

On the title page, item: [75] Inventors:, "Koji Kobayashi; Mitsuru Takai, both of Miyota, Japan" should read --Koji Kobayashi; Mitsuru Takai, both of Nagano, Japan--.

Signed and Sealed this

Tenth Day of September, 1996

Attest:

BRUCE LEHMAN

*Attesting Officer*     *Commissioner of Patents and Trademarks*